(12) United States Patent
Gupta et al.

(10) Patent No.: US 11,171,619 B2
(45) Date of Patent: Nov. 9, 2021

(54) TRANSCONDUCTANCE BOOSTED CASCODE COMPENSATION FOR AMPLIFIER

(71) Applicant: STMicroelectronics International N.V., Geneva (CH)

(72) Inventors: Nitin Gupta, Kurukshetra (IN); Prashutosh Gupta, Ballia (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/829,088

(22) Filed: Mar. 25, 2020

(65) Prior Publication Data

US 2020/0343869 A1    Oct. 29, 2020

Related U.S. Application Data

(60) Provisional application No. 62/838,011, filed on Apr. 24, 2019.

(51) Int. Cl.
*H03F 3/45* (2006.01)
*H03G 1/00* (2006.01)
(Continued)

(52) U.S. Cl.
CPC ......... *H03F 3/45188* (2013.01); *H03F 1/223* (2013.01); *H03F 1/3211* (2013.01);
(Continued)

(58) Field of Classification Search
CPC .................................................. H03F 3/4518
See application file for complete search history.

(56) References Cited

U.S. PATENT DOCUMENTS 6,300,831 B1    10/2001  Xi
6,696,888 B2 *   2/2004  Gilbert ................... G01R 19/02
                                                         327/560
(Continued)

FOREIGN PATENT DOCUMENTS

GB           2223902 A      4/1990

OTHER PUBLICATIONS

Dasgupta, Uday: "Issues in 'Ahuja' Frequency Compensation Technique," 2009 IEEE International Symposium on Radio-Frequency Integration Technology, pp. 326-329.
(Continued)

*Primary Examiner* — Patricia T Nguyen
(74) *Attorney, Agent, or Firm* — Crowe & Dunlevy

(57) ABSTRACT

A differential pair of transistors receives input voltages. Current mirror transistors and cascode transistors are coupled to the differential pair of transistors. The differential pair of transistors is coupled between the cascode transistors and a tail transistor that draws a first bias current from a tail node, the first bias current having a magnitude equal to a product of a total bias current and a constant that is less than one. A first current source transistor draws a second bias current from a node between the differential pair and cascode transistors so the second bias current bypasses one transistor of the differential pair of transistors. The second bias current has a magnitude equal to a product of the total bias current and a value equal to one minus the constant. An output stage is biased by an output at node between the cascode transistors and the current mirror transistors.

28 Claims, 9 Drawing Sheets

(51) Int. Cl.
  *H03F 1/32*  (2006.01)
  *H03F 1/22*  (2006.01)

(52) U.S. Cl.
  CPC ....... *H03F 3/45677* (2013.01); *H03G 1/0029* (2013.01); *H03F 2200/129* (2013.01); *H03F 2203/45054* (2013.01); *H03F 2203/45288* (2013.01)

(56) References Cited

U.S. PATENT DOCUMENTS

| | | | |
|---|---|---|---|
| 9,571,052 | B1 | 2/2017 | Trampitsch |
| 2005/0077967 | A1 | 4/2005 | Behzad et al. |
| 2007/0241818 | A1* | 10/2007 | Alenin ............... H03F 3/45291 330/257 |
| 2008/0030272 | A1* | 2/2008 | Golden .................... H03F 1/32 330/255 |
| 2008/0272844 | A1* | 11/2008 | Rayanakorn .......... H03F 3/3022 330/253 |
| 2009/0027122 | A1* | 1/2009 | Bajdechi ............... H03F 3/3023 330/253 |
| 2009/0289703 | A1* | 11/2009 | Kojima ............... H03F 3/45188 330/9 |
| 2010/0253431 | A1* | 10/2010 | Fujiwara ................ G05F 1/575 330/253 |
| 2014/0035665 | A1* | 2/2014 | Nicollini ............ H03F 3/45264 327/552 |
| 2017/0214367 | A1* | 7/2017 | Deo .................... H03F 3/45475 |
| 2018/0173258 | A1 | 6/2018 | Singh |

OTHER PUBLICATIONS

Ahuja, Bhupendra K.: "An Improved Frequency Compensation Technique for CMOS Operational Amplifiers," IEEE Journal of Solid-State Circuits, vol. SC-18, No. 6, Dec. 1983, pp. 629-633.

Aminzadeh, Hamed et al: "On the Power Efficiency of Cascode Compensation Over Miller Compensation in Two-Stage Operational Amplifiers," Journal of Circuits, Systems, and Computers, vol. 17, No. 1 (2008) 1-13.

* cited by examiner

TRANSCONDUCTANCE BOOSTED CASCODE COMPENSATION FOR AMPLIFIER

RELATED APPLICATION

This application claims priority to U.S. Provisional Patent Application No. 62/838,011, filed Apr. 24, 2019, the contents of which are incorporated by reference in their entirety.

TECHNICAL FIELD

This disclosure is directed to the field of operational amplifiers, and in particular, to an operational amplifier design having transconductance boosted cascode compensation.

BACKGROUND

In the design of operational amplifiers, such as for use as an error amplifier, cascoded (stacked) transistors are used to increase gain and to provide enhanced high frequency power supply rejection ratios. However, this may result in a peaking in the frequency response of the amplifier, which may result in instability at higher frequencies. Therefore, it is known to increase the transconductance of the cascode to yield stability at higher frequencies.

One such design of an amplifier 20 is shown in FIG. 1A. The amplifier 20 is comprised of a differential input stage 21 and an output (or gain) stage 22. The differential input stage 21 includes a pair of differential input transistors Tdi1 and Tdi2 having control terminals that respectively receive a feedback voltage Vfb indicative of the output current Iout produced by the output stage 22 and a reference voltage Vref. Cascode transistors Tc1 and Tc2 are stacked between the pair of differential input transistors Tdi1 and Tdi2, and the load transistors Tm1 and Tm2. Note that transistors Tdi1 and Tdi2 are the same size as one another, that transistors Tc1 and Tc2 are the same size as one another, and that the transistors Tm1 and Tm2 are the same size as one another.

A tail current source transistor Tt controlled by a bias voltage Vb provides the bias current I for the differential input stage 21; therefore, note that the current through both Tdi1 and Tdi2 will be I/2 when Vref equals Vfb. The output stage 22 produces the output current Iout for the load as a function of the drain voltage of load transistor Tm2.

The frequency response of the amplifier 20 across gain is shown in FIG. 1B. Gain peaking can be observed. As the output current Iout increases, the gain peaking will worsen, potentially leading to high frequency instability. To reduce the gain peaking, it is known to increase the transconductance of the cascode transistors Tc1 and Tc2 by increasing the bias current I. However, this has the effect of increasing the transconductance of the pair of differential input transistors Tdi1 and Tdi2 as well, and therefore the unity gain bandwidth, which actually degrades stability. Therefore, this design is ineffective in some situations, as it would be preferable to increase the transconductance of the cascode transistors Tc1 and Tc2 independently of the pair of differential input transistors Tdi1 and Tdi2.

An amplifier design 20' that accomplishes this increase of the transconductance of the cascode transistors Tc1 and Tc2 independently of the pair of differential input transistors Tdi1 and Tdi2 is shown in FIG. 1C (note that full details of this design can be found in the publication B. K. Ahuja, "An improved frequency compensation technique for CMOS operational amplifiers", IEEE Journal of Solid State Circuits, vol. 18, no. 6, pp. 629-633, December 1983, incorporated by reference). Here, a common gate stage 23 is inserted between the differential input stage 21 and the output stage 22. The common gate stage 23 is comprised of cascode transistor Tcg2 stacked between transistor Tcg1 and transistor Tcgt. Transistors Tcg1 and Tcg2 are respectively biased by bias voltages Vbcg1 and Vbcg2, while transistor Tcgt is biased by the same bias voltage Vb as tail transistor Tt. Note that therefore a current Icg passes through the cascode transistor Tcg2. This increases the transconductance of the amplifier 20 at the cost of additional power consumption due to the added current Icg in the common gate stage 23.

This extra power consumption is undesirable in some applications. Therefore, further development is needed.

SUMMARY

Disclosed herein is an amplifier including a differential amplifier stage and an output stage. The amplifier stage includes a differential pair of transistors receiving a first voltage and a second voltage, a current mirror pair of transistors, and a cascode pair of transistors coupled between the differential pair at first and second nodes and the current mirror pair at third and fourth nodes. The differential pair are coupled between the cascode pair and a tail node. A tail transistor draws a first bias current from the tail node, the first bias current having a magnitude equal to a product of a total bias current and a constant k, with k being less than one. A first current source transistor draws a second bias current from second node so that the second bias current bypasses the second of the differential pair, the second bias current having a magnitude equal to a product of the total bias current and a value equal to one minus k. The output stage is biased by the fourth node.

The differential pair includes a first differential input transistor coupled between the first node and the tail node, the first differential input transistor receiving the first voltage. The differential pair also includes a second differential input transistor coupled between the second node and the tail node and receiving the second voltage. The current mirror pair includes a first current mirror transistor coupled between a supply voltage and the third node and a second current mirror transistor coupled between the supply voltage and the fourth node. The cascode pair includes a first cascode transistor coupled between the first and third nodes and a second cascode transistor coupled between the second and fourth nodes.

For a given size of the first cascode transistor being equal to k*given_size, a size of the second cascode transistor is equal to (2−k)*given_size. In addition, for a given size of the first current mirror transistor being equal to k*given_size, a size of the second current mirror transistor is equal to (2−k)*given_size. K is less than 1.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 2:
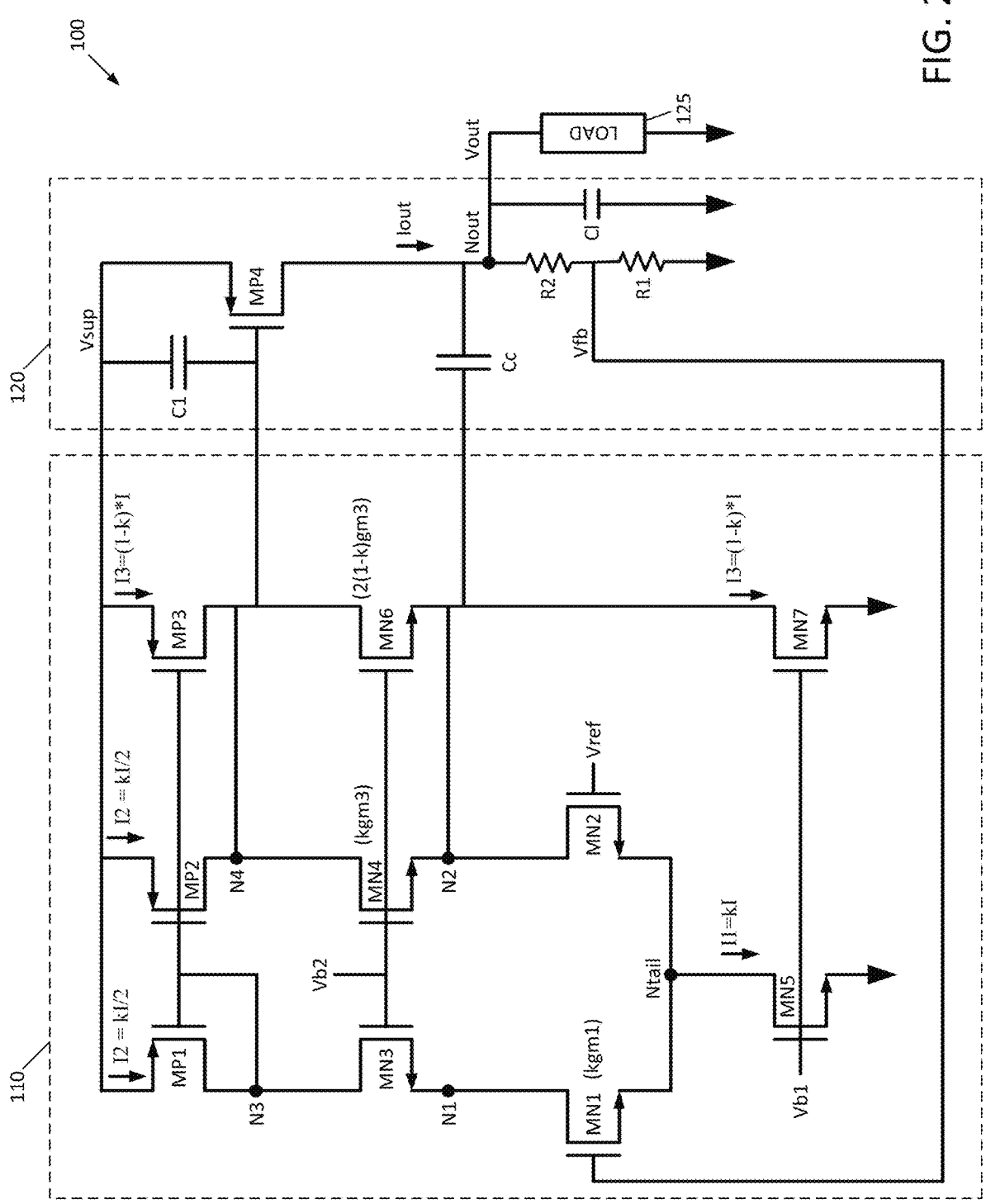
FIG. 2 is a schematic diagram of an amplifier with cascode compensation, in accordance with this disclosure.

Now described with reference to FIG. 2 is an amplifier 100 (e.g., an operational amplifier) having cascode compensation, with the transconductance of the cascode transistor being boosted in a way providing enhanced stability and reduced power consumption over the prior art designs.

The amplifier 100 includes a differential amplifier stage 110 (e.g., an error amplifier stage) and an output stage 120, and a load 125 is connected to the output stage 120.

The differential amplifier stage 110 includes a pair of differential input transistors MN1 and MN2 coupled to a tail current source transistor MN5, cascode transistors MN3 and MN4, and current mirror (or load) transistors MP1 and MP2.

In greater detail, the pair of differential input transistors is comprised of NMOS transistors MN1 and MN2. NMOS transistor MN1 has its source connected to tail node Ntail, its drain connected to first node N1, and its gate connected to receive the feedback voltage Vfb. NMOS transistor MN2 has its source connected to the tail node Ntail, its drain connected to the second node N2, and its gate connected to receive the reference voltage Vref. Note that the tail transistor MN5 is an NMOS transistor having its drain connected to the tail node Ntail, its source connected to ground, and its gate connected to receive a first bias voltage Vb1.

The cascode transistor MN3 is an NMOS transistor having its drain connected to the first node N1, its source connected to a third node N3, and its gate connected to a second bias voltage Vb2. The cascode transistor MN4 is an NMOS transistor having its drain connected to the second node N2, its source connected to a fourth node N4, and its gate connected to the gate of the NMOS transistor MN3 and therefore the second bias voltage Vb2. The cascode transistors MN3 and MN4 have the same dimensions.

The current mirror transistor MP1 is a PMOS transistor having its source connected to a supply voltage Vsup, its drain connected to the third node N3, and its gate connected to its drain at the third node N3. The current mirror transistor MP2 is a PMOS transistor having its source connected to the supply voltage Vsup, its drain connected to the fourth node N4, and its gate connected to the gate of the PMOS transistor MP1 and thus the third node N3. PMOS transistors MP1 and MP2 have the same dimensions.

A compensation output transistor MP3, which is a PMOS transistor having its source connected to the supply voltage Vsup and thus to the source of transistor MP2, has its drain connected to the fourth node N4 and thus to the drain of transistor MP2, and its gate connected to the gates of the PMOS transistors MP1 and MP2. Cascode transistor MN6, which is an NMOS transistor, has its drain connected to node N4 and thus to the drain of the NMOS transistor MN4, its source connected to the second node N2 and thus to the source of transistor MN4, and its gate connected to the gates of NMOS transistors MN3 and MN4 and thus the second bias voltage Vb2. A current source transistor MN7, which is an NMOS transistor, has its drain connected to the second node N2 and thus to the sources of NMOS transistors MN6 and MN4, its source connected to ground, and its gate connected to the gate of NMOS transistor MN5 and thus the first bias voltage Vb1.

Figure 1A:
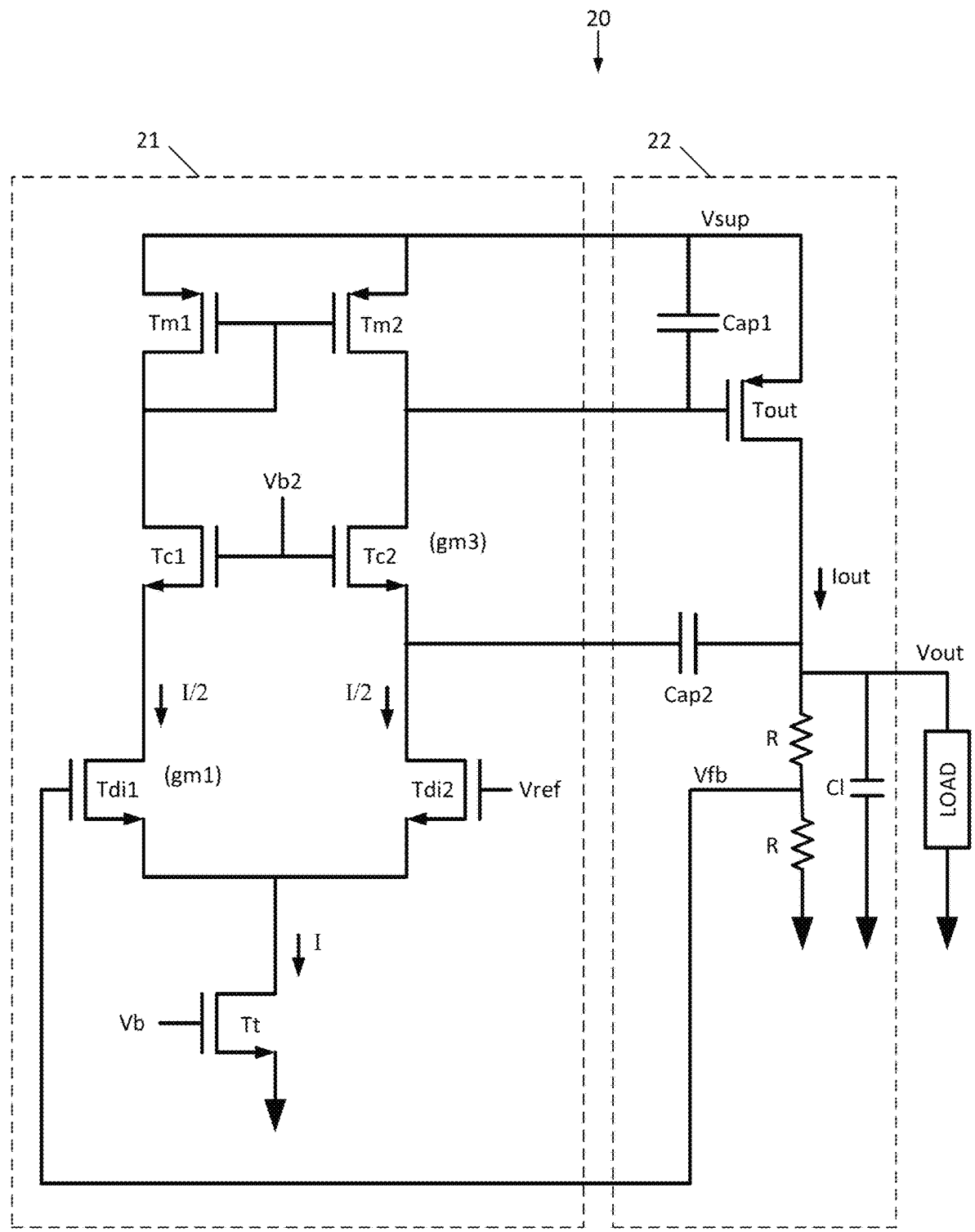
FIG. 1A is a schematic diagram of a prior art amplifier with cascode compensation.
Figure 1B:
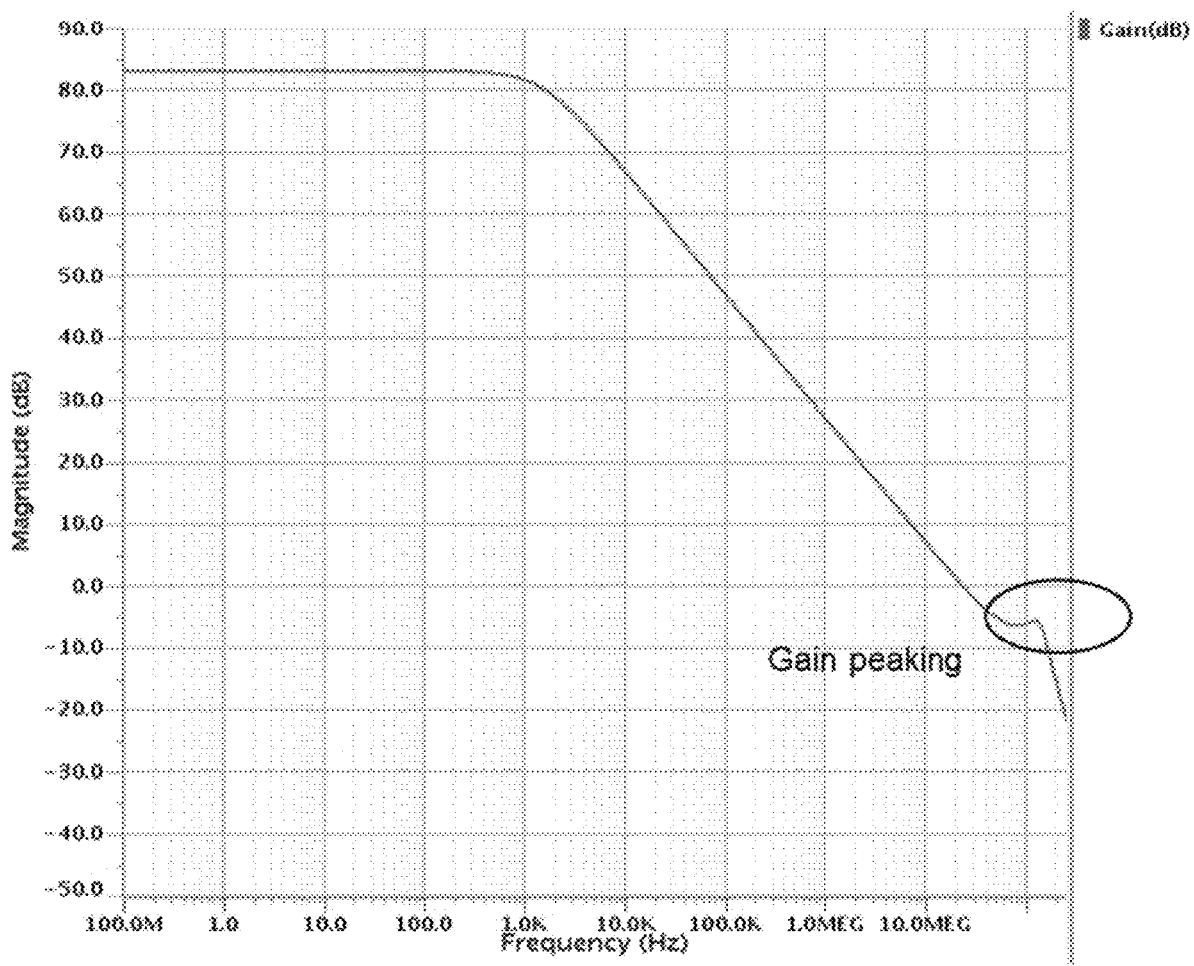
FIG. 1B is a graph of frequency response of amplifier of FIG. 1A across gain.
Figure 1C:
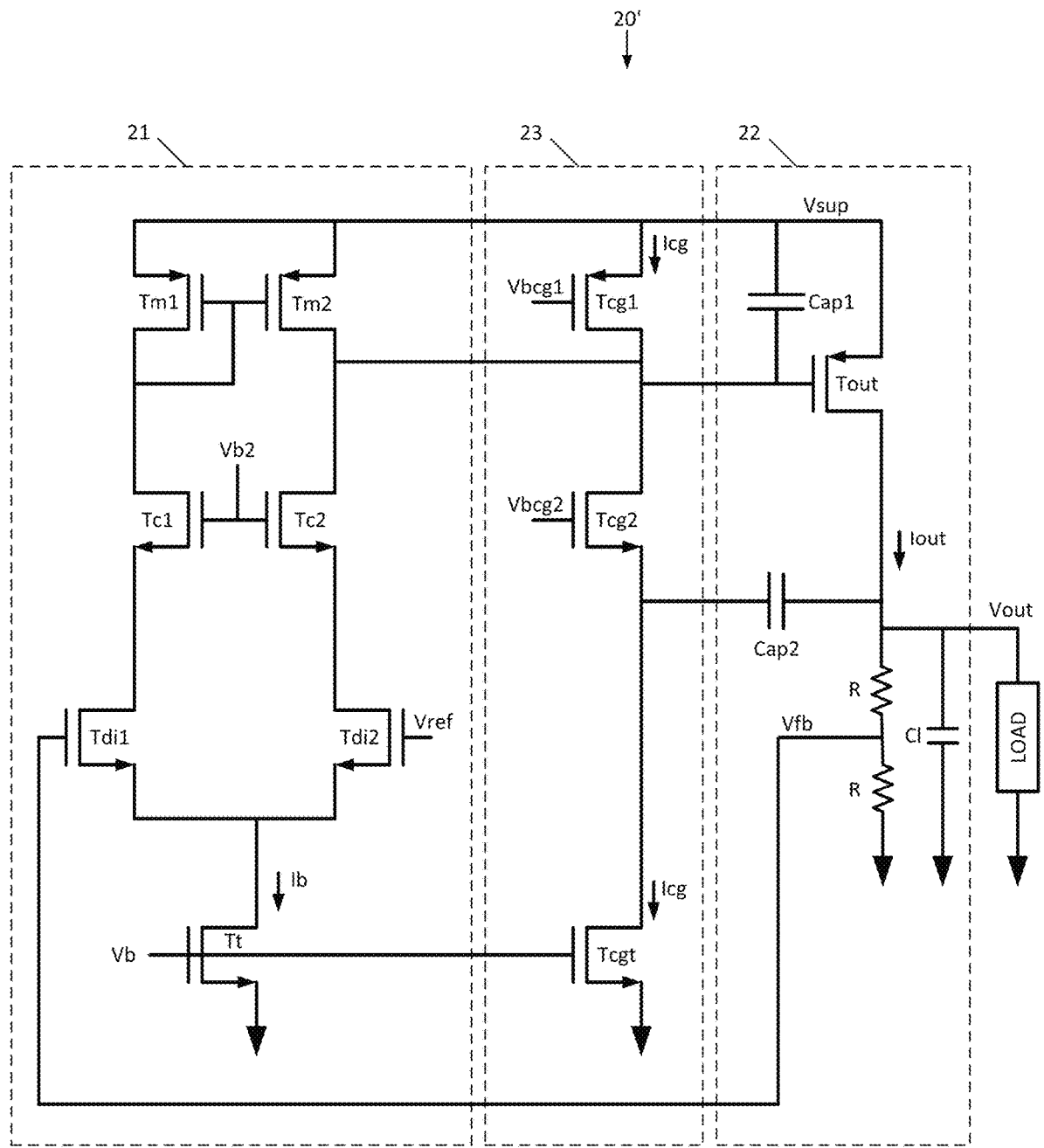
FIG. 1C is a schematic diagram of another prior art amplifier with cascode compensation.

It is to be noted that the sizes of transistors in FIG. 2 are scaled with respect to transistor sizes in FIG. 1A in the same ratio as the ratio of currents flowing through them.

Therefore, note that the size of MN5 is k*(the size of Tt), the size of MN1 is k*(the size of Tdi1), the size of MN2 is k*(the size of Tdi2), the size of MN3 is k*(the size of Tc1), the size of MN4 is k*(the size of Tc2), the size of MP1 is k*(the size of Tm1), and the size of MP2 is k*(the size of Tm2). Note therefore also that the size of MP3 is 2(1−k)*(the size of Tm1 or Tm2), that the size of MN6 is 2(1−k)*(the size of Tc1 or Tc2), and MN7 is (1−k)*(the size of MN5).

The output stage 120 includes PMOS transistor MP4 having its source connected to the supply voltage Vsup, its drain connected to output node Nout, and its gate connected to the fourth node N4 and thus the drains of PMOS transistors MP2 and MP3. Capacitor C1 represents the gate capacitance due to PMOS transistor MP4 and the parasitic capacitance at node N4. Compensation capacitor Cc is connected between the second node N2 and the output node Nout.

In operation, the differential pair MN1 and MN2 takes the difference between Vfb and Vref, and multiplies the difference by a gain. The cascode transistors MN4 and MN6 provide compensation through capacitor Cc, while the current mirror formed from transistors MP1, MP2, and MP3 forms the active load of the differential amplifier 110, and provides output of the differential amplifier 110 at node N4. The output transistor MP4 is biased by node N4, and generates the output current Tout. The feedback voltage Vfb is generated at the center tap of sense resistors R2 and R1 and is representative of the output current Tout.

The total bias current I for the differential amplifier stage 110 is split into two parts—current I1 through tail transistor MN5 and current I3 through tail transistor MN7. Note that current I1, drawn by the tail transistor MN5, is equal to k*I, while the current I2 drawn through each branch is I2=k*I/2 when Vref equals Vfb. The current I3 sourced by transistor MP3 and sunk by transistor MN7 is I3=(1−k)*I; therefore note that I=I1+I3=k*I+(1−k)*I. This splitting of the total bias current I means that the addition of the cascode compensation transistor MN6 to the differential amplifier stage consumes no extra power when compared to a prior art design having a bias current of I, such as that of FIG. 1A, yet it provides increased cascode transconductance as will be explained. Note that value of k as used in this example is less than 1, and is the same k and value as that listed for the transistor sizes above.

The addition of the cascode compensation transistor MN6 enables the effective boosting of the transconductance (labeled as kgm3) of the cascode transistor MN4 by the transconductance (labeled as 2(1−k)gm3) of MN6 to aid compensation, while leaving the overall transconductance of the differential amplifier 110 unaltered. Therefore, notice that instead of a cascode MN4 transconductance of gm3 such as would be present in a prior art design such as that of FIG. 1A, the effective transconductance for the cascode becomes:

$$kgm3+2(1-k)gm3=kgm3+2gm3-2kgm3=2gm3-kgm3$$

The boosting of the transconductance of the cascode transistor MN6 is accomplished by the feeding of current I3 into the drain of cascode transistor MN6 using transistor MP3, and the withdrawal of that current I3 from the source of cascode transistor MN6 using tail transistor MN7, and using the same bias for transistors MP2 and MP3 leaves the overall transconductance of the differential amplifier 110 unaltered.

Notice that the overall transconductance of the cascode transistors MN4 and MN6 is increased by a factor of (2−k) while maintaining the overall transconductance of the differential amplifier 110 the same.

Figure 3:
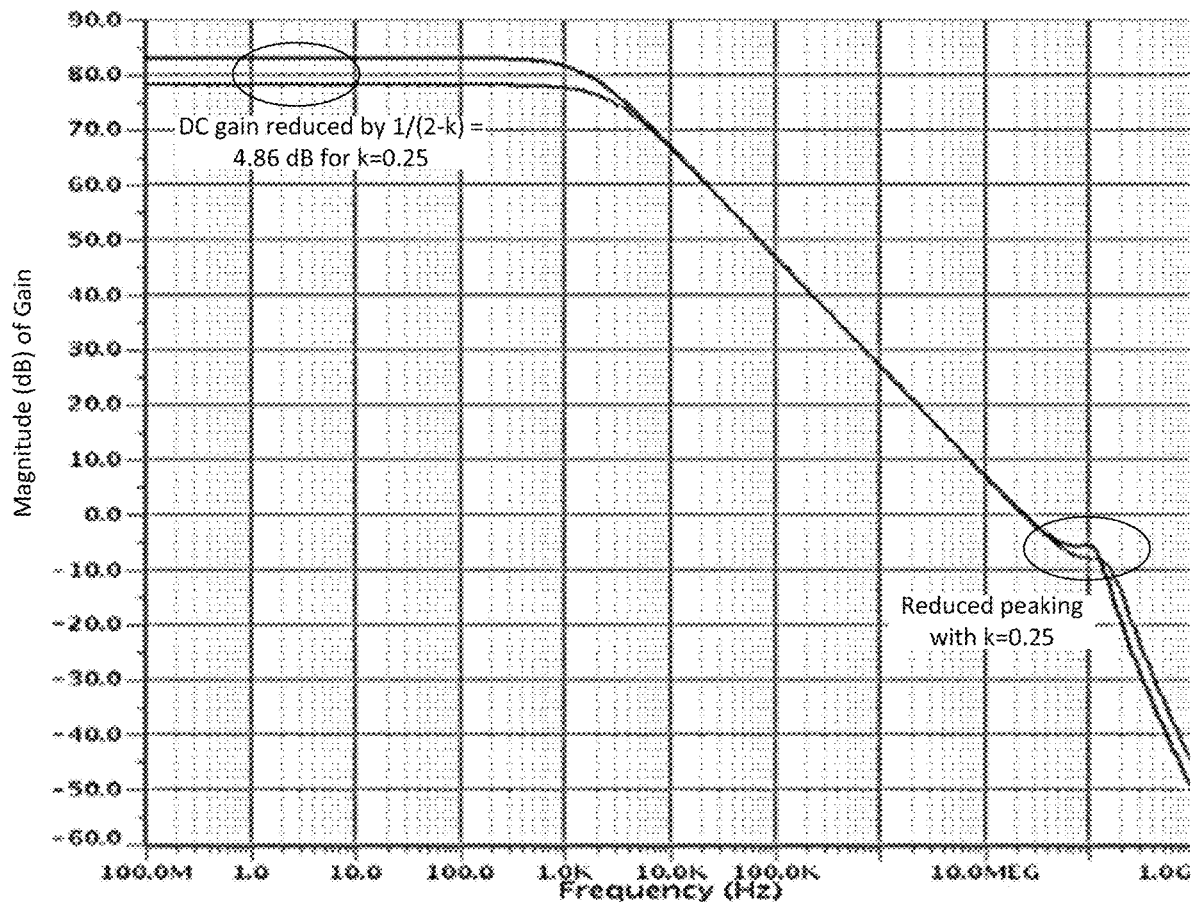
FIG. 3 is a graph of gain vs. frequency for the design of FIG. 2 as opposed to prior art designs.
Figure 4:
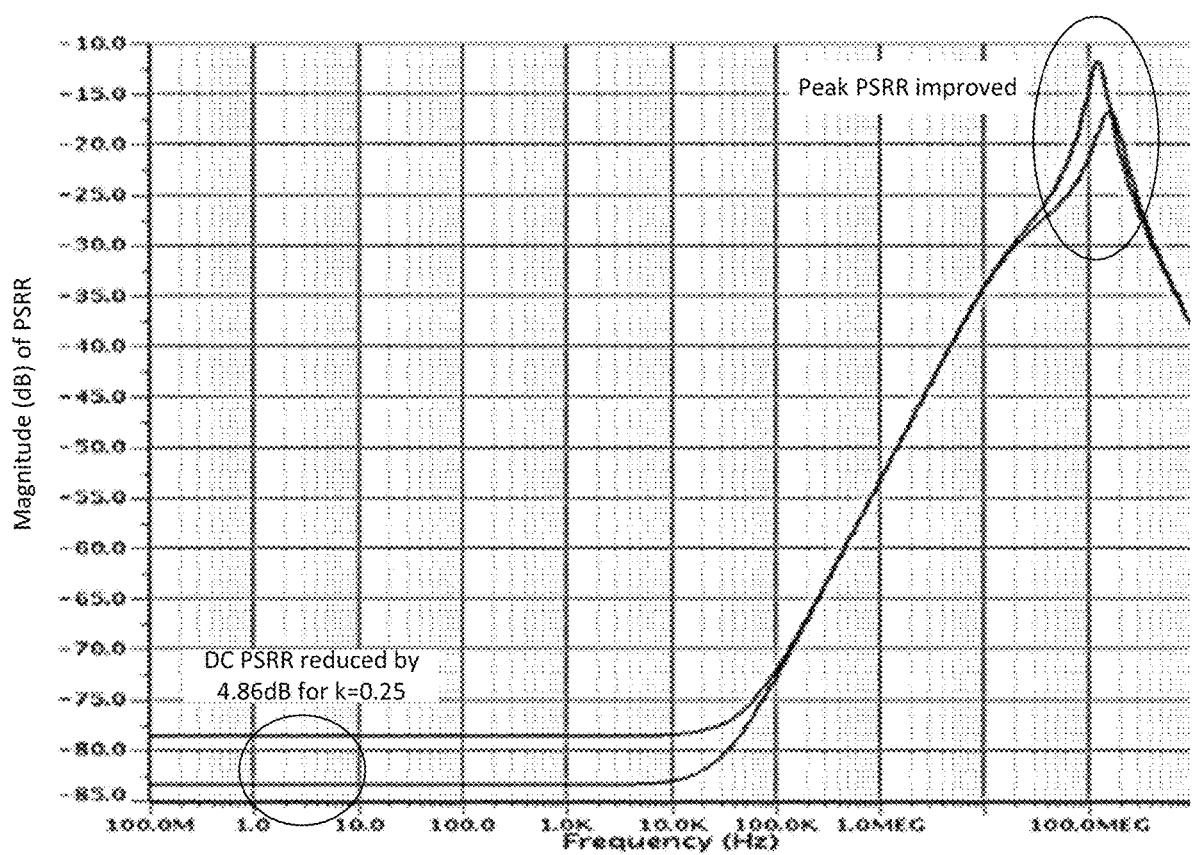
FIG. 4 is a graph of power supply rejection ratio (PSRR) vs. frequency for the design of FIG. 2 as opposed to prior art designs.

The improved performance of the design of the amplifier 100 over the prior art designs can be seen, for example, from the graph of FIG. 3, which shows a reduction of DC gain by 4.86 dB (e.g., a reduction by a factor of 1/(2−k) for k=0.25), unchanged high frequency performance, and reduced peaking. Also note the graph of FIG. 4, which shows a reduction in DC power supply rejection ratio (PSRR) of 4.86 dB (e.g., a reduction by a factor of 1/(2−k) for k=0.25), unchanged mid frequency PSRR, and improved high frequency and peak PSRR due to the transconductance increase provided by the cascode compensation transistor MN6.

Figure 5:
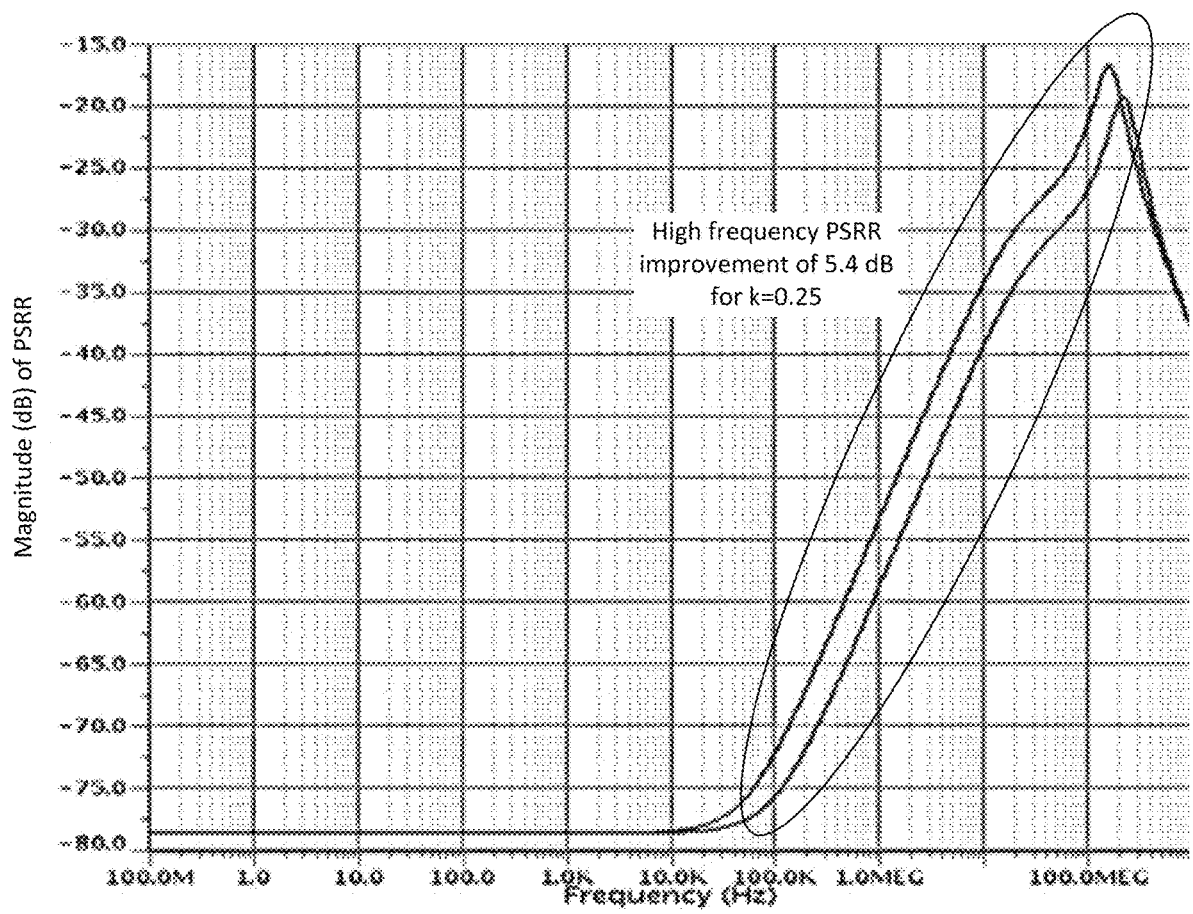
FIG. 5 is another graph of power supply rejection ratio (PSRR) vs. frequency for the design of FIG. 2 as opposed to prior art designs.

If one were to attempt to achieve the same increase in transconductance of the amplifier 100 using the design of FIG. 1A, for example, the current Icg would need to be equal to I*(1-0.5 k). Therefore, the design of the amplifier 100 reduces current consumption by I*(1-0.5 k) over this prior art design. This also means that, given an equivalent current consumption would be acceptable, the transconductance could be improved by a factor of (2−0.5 k), which would in turn improve high frequency PSRR even further, keeping in mind that the value of Cap2 would need to be increased by a factor of $\sqrt{2-0.5k}$ accordingly in order to maintain the same phase margin. Therefore, notice that in the graph of FIG. 5, low frequency PSRR remains unchanged while high frequency PSRR improves by 5.4 dB for k=0.25, keeping in mind that for the example of FIG. 5 the overall bias current I is increased by the amount of current saved over the prior art.

Those of skill in the art will appreciate that in the design of FIG. 2, instead of the use of transistor MP3 coupled in parallel with transistor MP2, and instead of the use of the transistor MN6 coupled in parallel with transistor MN4, the sizes of transistors MP2 and MP4 may instead be increased (while keeping the addition of transistor MN7 drawing current I3 from node N2).

Figure 6:
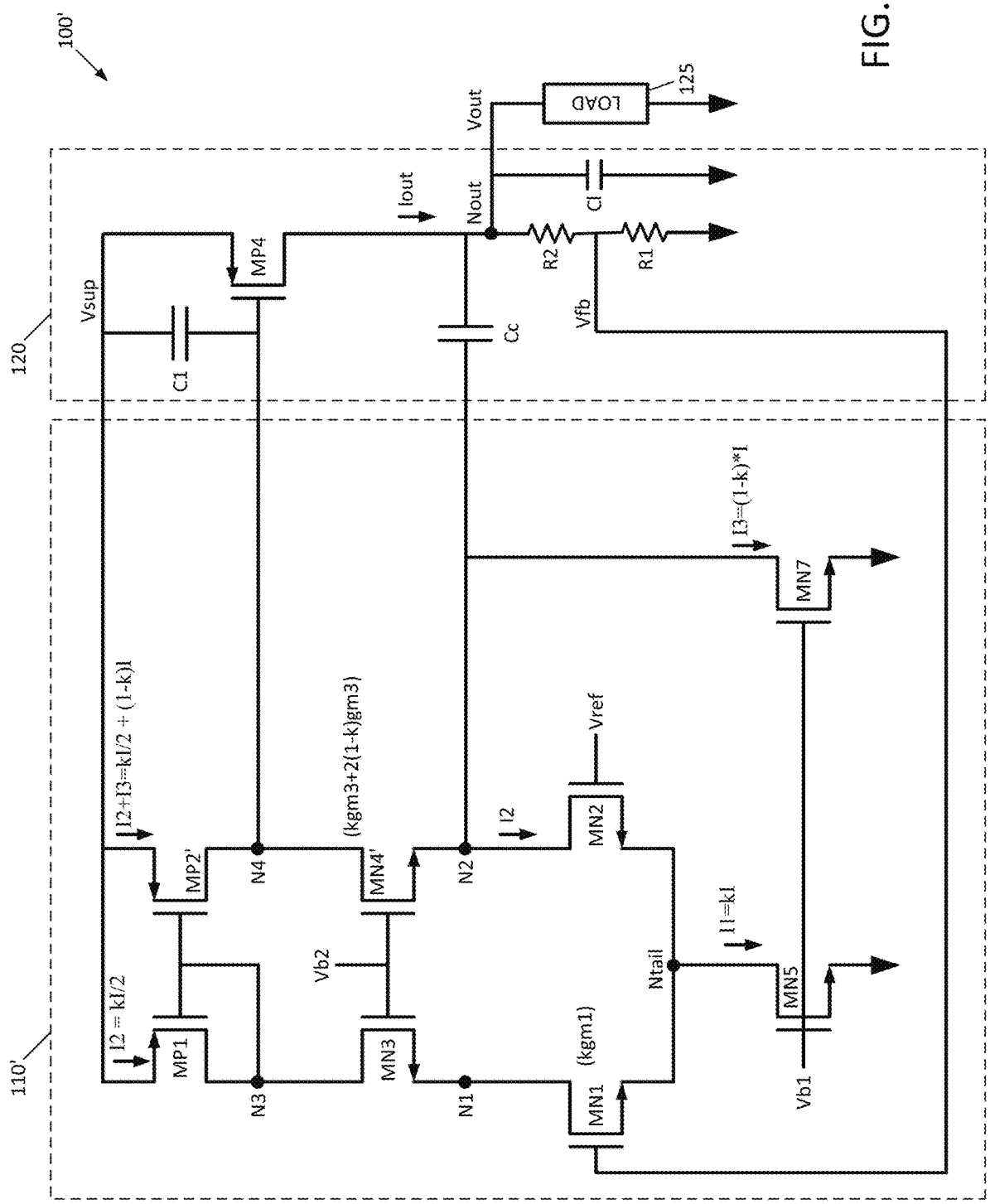
FIG. 6 is a schematic diagram of another amplifier with cascode compensation, in accordance with this disclosure.

Such an embodiment is shown in FIG. 6. In this embodiment, the amplifier 100' is comprised of the differential amplifier stage 110' and output stage 120. The output stage 120 remains as described above with reference to FIG. 2.

In this application, the differential amplifier stage 110' includes a pair of differential input transistors MN1 and MN2 coupled to a tail current source transistor MN5, cascode transistors MN3 and MN4', and current mirror (or load) transistors MP1 and MP2'.

In greater detail, the pair of differential input transistors is comprised of NMOS transistors MN1 and MN2. NMOS transistor MN1 has its source connected to tail node Ntail, its drain connected to first node N1, and its gate connected to receive the feedback voltage Vfb. NMOS transistor MN2 has its source connected to the tail node Ntail, its drain connected to the second node N2, and its gate connected to receive the reference voltage Vref. Note that the tail transistor MN5 is an NMOS transistor having its drain connected to the tail node Ntail, its source connected to ground, and its gate connected to receive a first bias voltage Vb1.

The cascode transistor MN3 is an NMOS transistor having its drain connected to the first node N1, its source connected to a third node N3, and its gate connected to a second bias voltage Vb2. The cascode transistor MN4' is an NMOS transistor having its drain connected to the second node N2, its source connected to a fourth node N4, and its gate connected to the gate of the NMOS transistor MN3 and therefore the second bias voltage Vb2.

The current mirror transistor MP1 is a PMOS transistor having its source connected to a supply voltage Vsup, its drain connected to the third node N3, and its gate connected to its drain at the third node N3. The current mirror transistor MP2' is a PMOS transistor having its source connected to the supply voltage Vsup, its drain connected to the fourth node N4, and its gate connected to the gate of the PMOS transistor MP1 and thus the third node N3.

An NMOS transistor MN7 has its drain coupled to node N2 and capacitor Cc, its source coupled to ground, and its gate coupled to the bias voltage Vb1.

Transistors MP1, MN1, MN2, MN3, and MN5 each have a size of k*the size of transistors Tm1, Tid1, Tid2, Tc1 and Tt respectively of FIG. 1A. Transistors MP2' and MN4' have a size of (2−k)*the size of transistor Tm2 and Tc2 respectively of FIG. 1A.

In operation of the differential amplifier 100, the differential pair MN1 and MN2 take the difference between Vfb and Vref, and multiply the difference by a gain. The cascode transistors MN3 and MN4' provide compensation, while the current mirror formed from transistors MP1 and MP2' forms the active load of the differential amplifier stage 110, and provides the output of the differential amplifier 110 at node N4. The output transistor MP4 is biased by node N4, and generates the output current Iout. The feedback voltage Vfb is generated at the center tap of sense resistors R2 and R1 and is representative of the output current Tout.

Here, note that the bias current I1 sunk by transistor MN5 is equal to kI, that current I2 sourced by transistor MP1 is equal to kI/2 when Vref is equal to Vfb, and that the current I3 sunk by transistor MN7 is equal to (1−k)I, while the current sourced by transistor MP2' is I2+I3=kI/2+(1−k)I when Vref is equal to Vfb. The result of this is that the increased current I2+I3 sourced by the current mirror transistor MP2' to the cascode transistor MN4' causes an increase in transconductance of MN4', without increasing the transconductance of the transistor MN2 (since MN2 sinks the current I2, as current I3 bypasses MN2). Therefore, the transconductance of the transistor MN2 remains kgm1, while the transconductance of the cascode transistor MN4' increases to:

$$kgm3+2(1-k)gm3=2gm3-kgm3$$

The overall transconductance of the differential amplifier 110' remains as gm1.

Figure 7:
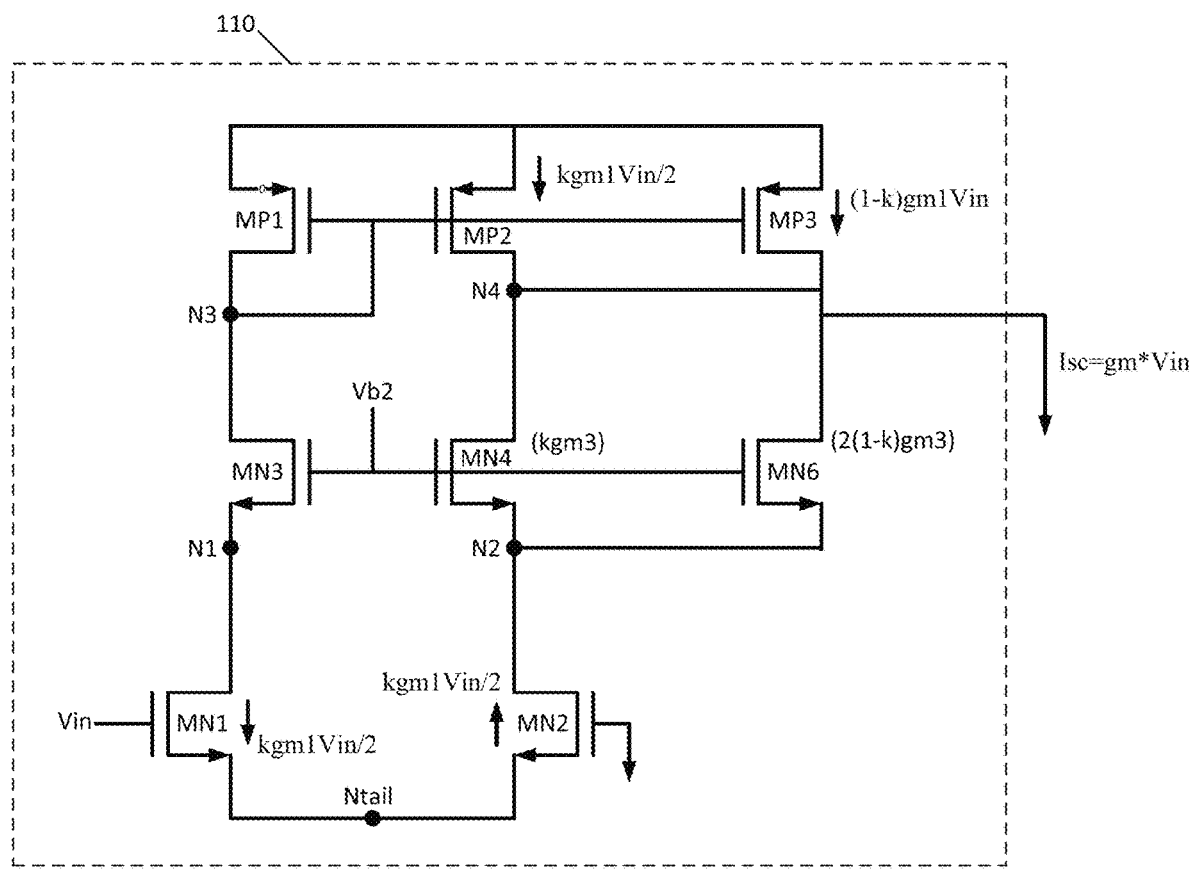
FIG. 7 is a schematic diagram of the differential amplifier of FIG. 2 illustrating small signal analysis.

This can perhaps be easiest seen referring to the small signal diagram of the differential amplifier 110' shown in FIG. 7. From this, it can be easily observed that the overall transconductance of the differential amplifier 110' is gmin=gm1, and is therefore unchanged. The transconductance of the cascode transistor MN4' is gmcas=(2−k)gm3, as stated above, therefore being increased by a factor of 2−k over the prior art. Therefore, appreciate that with the design of the differential amplifier 110' (as well as that of the differential amplifier 110), the overall cascode device transconductance is increased by a factor of 2-k, but the input transconductance remains the same for a same total bias current I. Therefore, power is saved.

The performance of amplifier 100' of FIG. 6 remains unchanged from that of FIG. 2, and therefore the previously presented graphs are applicable.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An amplifier, comprising:
an amplifier stage comprising:
a differential pair of transistors receiving a first voltage and a second voltage;
a current mirror pair of transistors;
a cascode pair of transistors coupled between the differential pair of transistors at first and second nodes and the current mirror pair of transistors at third and fourth nodes;
wherein the differential pair of transistors are coupled between the cascode pair of transistors and a tail node; and
a tail transistor drawing a first bias current from the tail node, the first bias current having a magnitude equal to a product of a total bias current and a constant k, the constant k being less than one;
a first current source transistor drawing a second bias current from the first node or second node so that the second bias current bypasses one of the differential pair of transistors, the second bias current having a magnitude equal to a product of the total bias current and a value equal to one minus k; and
an output stage biased by the third or fourth node.

2. The amplifier of claim 1, further comprising:
a second current source transistor coupled in parallel with one transistor of the current mirror pair of transistors; and
a compensation cascode transistor coupled in parallel with one transistor of the cascode pair of transistors;
wherein the second current source transistor sources the second bias current to the compensation cascode transistor and the first current source transistor sinks the second bias current from the compensation cascode transistor.

3. The amplifier of claim 1, wherein the differential pair of transistors comprises a first differential input transistor coupled between the first node and the tail node and receiving the first voltage and a second differential input transistor coupled between the second node and the tail node and receiving the second voltage; wherein the current mirror pair of transistors comprises a first current mirror transistor coupled between a supply voltage and the third node and a second current mirror transistor coupled between the supply voltage and the fourth node, the first and second current mirror transistors being in a current mirror relationship; wherein the cascode pair of transistors comprises a first cascode transistor coupled between the first and third nodes and a second cascode transistor coupled between the second and fourth nodes.

4. The amplifier of claim 3, further comprising:
a second current source transistor coupled in parallel with the second current mirror transistor; and
a compensation cascode transistor coupled in parallel with the second cascode transistor;
wherein the second current source transistor sources the second bias current to the compensation cascode transistor and the first current source transistor sinks the second bias current from the compensation cascode transistor.

5. The amplifier of claim 4, wherein for a given size of the second current mirror transistor being equal to k*given_size, a size of the second current source transistor is (1-k)*given_size; and wherein for a given_size of the second cascode transistor being equal to k*given_size, a size of the compensation cascode transistor is 2(1-k)*given_size.

6. The amplifier of claim 3, wherein the second current mirror transistor is larger than the first current mirror transistor; and wherein the second cascode transistor is larger than the first cascode transistor.

7. The amplifier of claim 6, wherein, for a given size of the first cascode transistor being equal to k*given_size, a size of the second cascode transistor is equal to (2-k)*given_size; and wherein, for a given_size of the first current mirror transistor being equal to k*given_size, a size of the second current mirror transistor is equal to (2-k)*given_size.

8. The amplifier of claim 1, wherein the amplifier stage is an error amplifier stage, with the first voltage being a feedback voltage representative of a current delivered by the output stage to a load and with the second voltage being a reference voltage.

9. An amplifier, comprising:
an amplifier stage comprising:
a differential pair of transistors receiving a first voltage and a second voltage;
a current mirror pair of transistors; and
a cascode pair of transistors coupled between the differential pair of transistors and the current mirror pair of transistors;
a cascode compensation stage comprising:
an output transistor biased by the current mirror pair of transistors and being directly electrically connected between a supply voltage and a first node;
a compensation cascode transistor biased by the cascode pair of transistors and being directly electrically connected between the first node and a second node; and
a current source transistor directly electrically connected between the second node and ground; and
an output stage comprising a transistor having a gate directly electrically connected to the cascode compensation stage, the transistor being directly electrically connected between the supply voltage and an output voltage.

10. The amplifier of claim 9, wherein:
the differential pair of transistors comprises first and second differential input transistors;
the current mirror pair of transistors comprises first and second current mirror transistors; and
the cascode pair of transistors comprise first and second cascode transistors respectively coupled between the first and second differential input transistors and the first and second current mirror transistors; and
wherein:
the output transistor has a same bias as the second current mirror transistor; and the compensation cascode transistor has a same bias as the second cascode transistor.

11. An amplifier, comprising:
an amplifier stage, wherein the amplifier stage comprises an error amplifier stage the error amplifier stage comprising:
  a differential pair of transistors receiving a first voltage and a second voltage, the differential pair of transistors comprising first and second differential input transistors, wherein the first voltage comprises a feedback voltage and the second voltage comprises a reference voltage;
  a current mirror pair of transistors, the current mirror pair of transistors comprises first and second current mirror transistors; and
  a cascode pair of transistors coupled between the differential pair of transistors and the current mirror pair of transistors, the cascode pair of transistors comprising first and second cascode transistors respectively coupled between the first and second differential input transistors and the first and second current mirror transistors;
a cascode compensation stage comprising:
  an output transistor biased by the current mirror pair of transistors, wherein the output transistor has a same bias as the second current mirror transistor; and
  a compensation cascode transistor biased by the cascode pair of transistors, wherein the compensation cascode transistor has a same bias as the second cascode transistor; and
an output stage coupled to the cascode compensation stage, wherein the output stage comprises:
  an output transistor is biased by output of the output transistor of the cascode compensation stage and generating a load current; and
  a sense resistance configured to generate the second voltage as a function of the load current.

12. An amplifier, comprising:
an amplifier stage;
a differential pair of transistors receiving a first voltage and a second voltage, wherein the differential pair of transistors comprises:
  a first NMOS transistor having a drain, a source coupled to a tail node, and a gate coupled to receive the second voltage; and
  a second NMOS transistor having a drain, a source coupled to the tail node, and a gate coupled to receive the first voltage;
a current mirror pair of transistors, wherein the current mirror pair of transistors comprises:
  a first PMOS transistor having a source coupled to a supply node, a drain coupled to a first intermediate node, and a gate coupled to the drain of the first PMOS transistor; and
  a second PMOS transistor having a source coupled to the supply node, a drain coupled to a second intermediate node, and a gate coupled to the gate of the first PMOS transistor;
a cascode pair of transistors coupled between the differential pair of transistors and the current mirror pair of transistors, wherein the cascode pair of transistors comprises:
  a third NMOS transistor having a drain coupled to the first intermediate node, a source coupled to the drain of the first NMOS transistor, and a gate; and
  a fourth NMOS transistor having a drain coupled to the second intermediate node, a source coupled to the drain of the second NMOS transistor, and a gate coupled to the gate of the third NMOS transistor; and
a cascode compensation stage comprising:
  an output transistor biased by the current mirror pair of transistors; and
  a compensation cascode transistor biased by the cascode pair of transistors; and
an output stage coupled to the cascode compensation stage;
a tail current source comprising a fifth NMOS transistor having a drain coupled to the tail node, a source coupled to ground, and a gate;
wherein the output transistor of the cascode compensation stage comprises a third PMOS transistor having a source coupled to the supply node, a drain coupled to the drain of the second PMOS transistor, and a gate coupled to the gates of the first and second PMOS transistors;
wherein the compensation cascode transistor of the cascode compensation stage comprises a sixth NMOS transistor having a drain coupled to the drain of the third PMOS transistor, and a gate coupled to the gates of the third and fourth NMOS transistors; and
wherein the cascode compensation stage comprises a seventh NMOS transistor having a drain coupled to the source of the sixth NMOS transistor, a source coupled to ground, and a gate coupled to the gate of the fifth NMOS transistor.

13. The amplifier of claim 12, wherein the output stage comprises:
  a fourth PMOS transistor having a source coupled to the supply node, a drain coupled to an output node, and a gate coupled to the drains of the second and third PMOS transistors;
  a capacitor coupled between the gate of the fourth PMOS transistor and the supply node;
  a compensation capacitor coupled between the source of the sixth NMOS transistor and the output node; and
  a voltage divider coupled between the output node and ground, with the second voltage being produced a center tap of the voltage divider, and with the center tap of the voltage divider being coupled to the gate of the first NMOS transistor.

14. The amplifier of claim 12, wherein the gates of the fifth and seventh NMOS transistors are coupled to receive a first bias voltage.

15. The amplifier of claim 9, wherein the differential pair of transistors comprises a first transistor having a gate coupled to the second voltage and a second transistor having a gate coupled to the first voltage; and wherein transconductance of the first transistor of the differential pair of transistors is decoupled from transconductance of the compensation cascode transistor of the cascode compensation stage.

16. The amplifier of claim 9, wherein the current mirror pair of transistors comprise transistors having a same ratio of length to width as one another; wherein the cascode pair of transistors comprise transistors having a same ratio of length to width as one another; and wherein:
  the differential pair of transistors comprises first and second differential input transistors;
  the current mirror pair of transistors comprises first and second current mirror transistors, with the second current mirror transistor being coupled in parallel with the output transistor of the cascode compensation stage; and the cascode pair of transistors comprise first and second cascode transistors respectively coupled between the first and second differential input transistors and the first and second current mirror transistors, with the second cascode transistor being coupled in parallel with the compensation cascode transistor.

17. The amplifier of claim 16, wherein the amplifier stage further comprises a tail current source configured to sink a first current from a tail node; wherein the first differential input transistor is configured to source a second current to the tail node; wherein the second differential input transistor is also configured to source the second current to the tail node; wherein the first current mirror transistor is configured to source the second current to the first cascode transistor; wherein the second current mirror transistor is configured to source the second current to the second cascode transistor; wherein the second current is equal to one half of the first current; wherein the output transistor is configured to source a third current to the cascode compensation transistor; and wherein the cascode compensation stage further comprises a current sinking transistor configured to sink the third current from the cascode compensation transistor such that the third current bypasses the second differential input transistor.

18. The amplifier of claim 9, wherein the amplifier stage further comprises a tail current source configured to sink a first current from a tail node; wherein the current mirror pair of transistors are each configured to source a second current to one of the cascode pair of transistors, the second current being equal to one half of the first current; wherein the differential pair of transistors are each configured to source the second current to the tail node; wherein the output transistor is configured to source a third current to the cascode compensation transistor; and wherein the cascode compensation stage further comprises a current sinking transistor configured to sink the third current from the cascode compensation transistor such that the third current bypasses the differential pair of transistors.

19. An amplifier, comprising:
an amplifier stage comprising:
first and second differential input transistors respectively receiving first and second voltages;
first and second current mirror transistors;
first and second cascode transistors coupled between the first and second differential input transistors and first and second current mirror transistors; and
a tail current source coupled to sink a first current from the first and second differential input transistors such that the first and second differential input transistors each source a second current to the tail current source, the second current being equal to one half the first current;
a current source configured to sink a third current from the second cascode transistor such that the third current bypasses the second differential input transistor; and
an output stage biased by the second current mirror transistor and second cascode transistor;
wherein the first current mirror transistor is configured to source the second current to the first cascode transistor, but the second current mirror transistor is sized differently than the first current mirror transistor so as to source a current equal to a sum of the second current and the third current to the second cascode transistor;
wherein the first cascode transistor is configured to source the second current to the first differential input transistor, but the second cascode transistor is size differently than the first cascode transistor so as to draw the current equal to the sum of the second current and the third current from the second current mirror transistor, such that the second cascode transistor has a larger transconductance than the first cascode transistor yet the second differential input transistor has a same transconductance as the first differential input transistor.

20. The amplifier of claim 19, wherein the second current mirror transistor is larger than the first current mirror transistor; wherein the second cascode transistor is larger than the first cascode transistor; and wherein the first and second differential input transistors have a same size.

21. The amplifier of claim 20, wherein the tail current source comprises a transistor; and wherein the current source comprises a transistor having a same size as the transistor of the tail current source.

22. The amplifier of claim 19, wherein the amplifier stage comprises an error amplifier stage; wherein the first voltage comprises a feedback voltage and the second voltage comprises a reference voltage; and wherein the output stage comprises:
an output transistor biased by the second current mirror transistor and second cascode transistor and generating a load current; and
a sense resistance configured to generate the second voltage as a function of the load current.

23. The amplifier of claim 19,
wherein the first differential input transistor comprises a first NMOS transistor having a drain, a source coupled to a tail node, and a gate coupled to receive the second voltage;
wherein the second differential input transistor comprises a second NMOS transistor having a drain, a source coupled to the tail node, and a gate coupled to receive the first voltage;
wherein the first current mirror transistor comprises a first PMOS transistor having a source coupled to a supply node, a drain coupled to a first intermediate node, and a gate coupled to the drain of the first PMOS transistor;
wherein the second current mirror transistor comprises a second PMOS transistor having a source coupled to the supply node, a drain coupled to a second intermediate node, and a gate coupled to the gate of the first PMOS transistor;
wherein the first cascode transistor comprises a third NMOS transistor having a drain coupled to the first intermediate node, a source coupled to the drain of the first NMOS transistor, and a gate;
wherein the second cascode transistor comprises a fourth NMOS transistor having a drain coupled to the second intermediate node, a source coupled to the drain of the second NMOS transistor, and a gate coupled to the gate of the third NMOS transistor; and
wherein the tail current source comprises a fifth NMOS transistor having a drain coupled to the tail node, a source coupled to ground, and a gate coupled to receive a bias voltage; and
wherein the current source comprises a sixth NMOS transistor having a drain coupled to the source of the fourth NMOS transistor, a source coupled to ground, and a gate also coupled to receive the bias voltage.

24. The amplifier of claim 23, wherein the output stage comprises:
a third PMOS transistor having a source coupled to the supply node, a drain coupled to an output node, and a gate coupled to the drain of the second PMOS transistor;
a capacitor coupled between the drain of the third PMOS transistor and the supply node;

a compensation capacitor coupled between the source of the fourth NMOS transistor and the output node; and a voltage divider coupled between the output node and ground, with the second voltage being produced a center tap of the voltage divider, and with the center tap of the voltage divider being coupled to the gate of the first NMOS transistor.

25. An amplifier, comprising:

an amplifier stage comprising:

first and second differential input transistors respectively receiving first and second voltages;

first and second current mirror transistors different in size from one another;

first and second cascode transistors different in size from one another and being coupled between the first and second differential input transistors and first and second current mirror transistors;

wherein the first and second current mirror transistors are coupled between a supply node and the first and second cascode transistors, wherein the supply node receives a positive supply voltage;

wherein the first and second differential input transistors are coupled between the first and second cascode transistors and a tail node; and a tail transistor coupled to sink a first current from the tail node;

a current source transistor coupled in parallel with the second current mirror transistor;

a compensation cascode transistor coupled in parallel with the second cascode transistor;

a second tail transistor drawing a second current from the second cascode transistor so that the second current bypasses the second differential input transistor; and an output transistor coupled between the supply node and an output node, the output transistor having a control terminal coupled to a drain of the current source transistor and a drain of the compensation cascode transistor.

26. The amplifier of claim 25, wherein for a given size of the second current mirror transistor being equal to k*given_size, a size of the compensation cascode transistor is (1−k)*given_size.

27. The amplifier of claim 25, wherein for a given size of the second cascode transistor being equal to k*given_size, a size of the compensation cascode transistor is 2(1−k)*given_size.

28. The amplifier of claim 25, wherein the amplifier stage is an error amplifier stage, with the first voltage being a feedback voltage representative of a current delivered by the output transistor to a load and with the second voltage being a reference voltage.

* * * * *